United States Patent [19]

Buscaglia et al.

[11] Patent Number: 4,636,990

[45] Date of Patent: Jan. 13, 1987

[54] THREE STATE SELECT CIRCUIT FOR USE IN A DATA PROCESSING SYSTEM OR THE LIKE

[75] Inventors: Carl U. Buscaglia, Clinton Corners, N.Y.; Lawrence E. Knepper, Boca Raton, Fla.

[73] Assignee: International Business Machines Corporation, Armonk, N.Y.

[21] Appl. No.: 739,785

[22] Filed: May 31, 1985

[51] Int. Cl.[4] .......................... G11C 8/00; G11C 7/00
[52] U.S. Cl. .................................. 365/230; 365/190; 307/455; 307/467
[58] Field of Search ............... 307/455, 467; 365/189, 365/230, 242, 190

[56] References Cited

U.S. PATENT DOCUMENTS

| | | | |
|---|---|---|---|
| 3,471,838 | 10/1969 | Ricketts, Jr. et al. | 365/194 |
| 3,590,274 | 6/1971 | Marley | 307/443 |
| 3,685,020 | 8/1972 | Meade | 364/200 |
| 3,686,640 | 8/1972 | Anderson et al. | 364/900 |
| 3,723,976 | 3/1973 | Alvarez et al. | 364/200 |
| 3,761,881 | 9/1973 | Anderson et al. | 364/200 |
| 3,761,898 | 9/1973 | Pao | 365/190 |
| 3,787,817 | 1/1974 | Goldberg | 364/172.5 |
| 3,800,289 | 3/1974 | Batcher | 364/172.5 |
| 3,925,691 | 12/1975 | Gaskill, Jr. et al. | 307/455 |
| 3,955,099 | 5/1976 | Gaskill, Jr. et al. | 307/455 |
| 3,958,222 | 5/1976 | Messina et al. | 364/200 |
| 4,044,338 | 8/1977 | Wolf | 364/900 |
| 4,070,657 | 1/1978 | Fett | 365/233 |
| 4,075,686 | 2/1978 | Calle et al. | 364/200 |
| 4,087,853 | 5/1978 | Kashio | 364/200 |
| 4,136,385 | 1/1979 | Gannon et al. | 364/200 |
| 4,219,883 | 8/1980 | Kobayashi | 365/189 |
| 4,222,112 | 9/1980 | Clemons | 365/189 |
| 4,241,425 | 12/1980 | Cenker | 365/222 |
| 4,268,907 | 5/1981 | Porter et al. | 364/200 |
| 4,286,173 | 8/1981 | Oka | 307/440 |
| 4,332,010 | 5/1982 | Messina | 364/200 |
| 4,596,002 | 6/1986 | Chan et al. | 365/189 |

OTHER PUBLICATIONS

"High-Speed Random-Access Memory with Simultaneous Read/Write Operation" by T. A. Williams, IBM Technical Disclosure Bulletin, vol. 17, No. 3, Aug. 1974, pp. 933-934.

"Bit Line Constant Source Switch for a Read-Only Store" by J. Perris and M. N. Shen, IBM Technical Disclosure Bulletin, vol. 20, No. 11A, Apr. 1978, pp. 4412-4414.

"Tri-State Read/Write Control Circuit" by V. Marcell, C. G. Rivadeneira & J. R. Struk, IBM Technical Disclosure Bulletin, vol. 24, No. 1B, Jun. 1981, p. 480.

"Bit Driver and Select Circuit for Schottky-Coupled Cell Arrays" by C. U. Buscaglia and L. E. Knepper, IBM Technical Disclosure Bulletin, vol. 24, No. 10, Mar. 1982, p. 5167.

Primary Examiner—James W. Moffitt
Assistant Examiner—Glenn A. Gossage
Attorney, Agent, or Firm—Wesley DeBruin

[57] ABSTRACT

An improved cascode current switch circuit particularly adapted for use in a data system or the like. The circuit provides a binary output, or an inhibit output under the control of a select/deselect input. The circuit includes interconnected upper and lower current switch circuits and is characterized by power reduction circuit means interconnecting the upper and lower current switches.

3 Claims, 8 Drawing Figures

THREE STATE SELECT CIRCUIT FOR USE IN A DATA PROCESSING SYSTEM OR THE LIKE

CROSS-REFERENCES TO RELATED APPLICATIONS

U.S. Ser. No. 509,674 entitled "Directory Memory System Having Simultaneous Write and ByPass Capabilities", filed June 30, 1983, by J. E. Anderson et al and of common assignee herewith.

U.S. Ser. No. 611,564 entitled "Dual Mode Logic Circuit For A Memory Array", filed May 18, 1984, by R. L. Barry and of common assignee herewith.

U.S. Ser. No. 666,580 entitled "Directory Memory System" filed Oct. 30, 1984 by J. E. Anderson et al and of common assignee herewith.

BACKGROUND OF THE INVENTION

Three state current switch emitter follower gate circuits for providing a differential output state or an inhibit state under control of a select/deselect signal are well known in the art. The differential output state facilitates the employment of a differential bus in data processing equipment such as directory memory systems. The advantages of a differential bus over a single ended bus are to a significant degree offset by the increased power and delay of the differential output gate circuits of the prior art.

The tri-state current switch emitter follower gate circuit in accordance with the invention provides the advantages of differential bussing without incurring the power consuming penalty inherent in prior art differential output gate circuits.

In a directory memory system the use of gate circuits, in accordance with the invention, results in a differential data signal which eliminates read 0/read 1 skew and the problems inherent in generating a tracking reference.

As stated above, the present invention has particular utility and advantage when employed in a directory memory system for use in a data processing system having a cache memory, and more particularly to a directory memory system formed in a monolithic integrated circuit having the capability of performing simultaneous write/compare, read/compare, compare/bypass, write/bypass, or write/compare/bypass operations.

Directory memory systems, particularly directory memory systems fabricated in a single integrated circuit chip, have recently found increasing use in high-speed data processing systems. One example of such a directory memory system is described in U.S. Pat. No. 4,219,883 to Kobayashi et al. Such devices can be used advantageously to perform a number of different functions within the data processing system. One example is in a cache memory, which is a small, high-speed memory functionally positioned between a main, slower memory and a central processor. The cache memory stores the most frequently used data retrieved by the processor from the main memory for rapid access by the processor. Another application of a directory memory is in a "trace" system in which a predetermined amount of the data most recently used by the processor is stored for examination to locate possible faults within the data processing system. Many other applications, of course, are possible.

A directory memory system should generally have the capability of performing the functions of writing input data into a memory block for temporary storage therein, reading data from the memory block onto an output data bus, comparing designated portions of the data stored in the memory block with comparison data, and bypassing the comparison data onto the output data bus under certain conditions. The capabilities of directory memories are further enhanced by dividing the memory block array into two or more subarrays which are addressable either individually or in various combinations.

Directory memories which store and compare addresses associated with main and cache memories, and which have a memory array divided into two or more subarrays are well known. Typical systems are disclosed in U.S. Pat. Nos. 3,685,020 to Meade, 3,723,976 to Alvarez et al., 3,761,881 to Anderson et al., 4,044,338 to Wolf, 4,136,385 to Gannon et al., and 4,332,010 to Messina et al. Memory systems having two or more subarrays which are reconfigurable for write and/or read operations are disclosed in U.S. Pat. Nos. 3,686,640 to Andersen et al., 3,787,817 to Goldberg, 3,800,289 to Batcher, 3,958,222 to Messina et al., 4,087,853 to Kashio, 4,222,112 to Clemons et al., and 4,241,425 to Cenker et al. A memory having subarrays is also described in "Bit Line Constant Current Source Switch For A Read-Only-Store" by J. Perris et al., IBM TDB Vol. 20, No. 11A, April 1978, pp. 4412–4414.

Memory systems which have the capability of performing simultaneous operations have been disclosed. For example, systems which simultaneously write data into and read data from a memory array are described in U.S. Pat. Nos. 3,471,838 to Ricketts, Jr. et al., 3,761,898 to Pao, 4,070,657 to Fett, and in an article entitled "High-Speed Random-Access Memory With Simultaneous Read/Write Operation" by T. A. Williams, IBM TDB Vol. 17, No. 3, August 1974, pp. 933-934. Cache memories which perform a bypass function are disclosed in U.S. Pat. Nos. 4,075,686 to Calle et al. and 4,268,907 to Porter et al. A directory memory system including a simultaneous write and bypass function is disclosed in copending U.S. application Ser. No. 509,674, cited above, and a logic circuit having a bypass circuit therein is described in U.S. Pat. No. 4,286,173 to Oka et al.

Several prior directory memory systems are capable of performing simultaneous operations, however, these are limited to either compare, read/write, or write/bypass operations. This limited functionality is disadvantageous in that a greater number of memory or control cycles are required to complete the various operations. The overall processing speed of a data processing system is significantly increased by performing additional various combinations of operations simultaneously. A directory memory system having the capability of performing simultaneous write/compare read/compare, compare/bypass, write/bypass, or write/compare/bypass operations is disclosed and claimed in the above referenced related U.S. patent application Ser. No. 666,580 filed Oct. 30, 1984 and of common assignee herewith.

DESCRIPTION OF THE PRIOR ART

One directory memory system timing more important to data processing systems having a cache memory is the directory address to data output delay. The directory system select circuit is in this path, therefore it is desirable to reduce the select circuit delay as much as possible. Additionally the select circuit is replicated many times on a directory chip, typically it is the 3rd most numerous circuit after the cell and compare circuit. Therefore it is advantageous to be able to have the circuit layout as small as possible.

Prior art circuits that have a single ended output provide small layout but do not have the symmetrical switching characteristics of differential select circuits and require a tracking reference. These desirable characteristics are smaller signal swings for better performance, better common mode noise immunity and no read 0/read 1 delay skew.

Prior art differential circuits employed cumbersome means for providing the negative inhibit. The negative inhibit implementations added delay, area and power due to inverter stages placed between the current switch and the emitter follower outputs, or additional current means for inhibit.

Prior art circuits incorporating three state select without cascode are not suited for directory chip bit select requirements due to input level incompatibility with sense amplifier and byte decode output levels. These circuits without cascode will not allow simultaneous write/bypass. Also implementation of tri-level switching inputs is required of three state select circuits without cascode. Tri-level switching inputs require large signal swings which cause increased delay as well as poor signal margin.

A number of logical gate switching networks, in particular series coupled switching networks with asymmetric control, utilizing emitter coupled logic (or current switch) technology are known to the art. It is to be appreciated, with reference to the subject invention, that the following art is not submitted to be the only prior art, the best prior art, or the most pertinent prior art.

BACKGROUND ART

U.S. Patents

U.S. Pat. No. 3,590,274 entitled "Temperature Compensated Current Mode Logic Circuit" granted June 29, 1971 to R. R. Marley.

U.S. Pat. No. 3,925,691 entitled "Cascode Node Idle Current Injection Means" granted Dec. 9, 1975 to James R. Gaskill, Jr. et al.

U.S. Pat. No. 3,955,099 entitled "Diode Controlled Idle Current Injection" granted May 4, 1976 to James R. Gaskill, Jr. et al.

IBM Technical Disclosure Bulletin Publications

"Tri-State Read/Write Control Circuit" by V. Marcello et al, Vol. 24, No. 1B, June 1981, pages 480–482.

"Bit Driver and Select Circuit For Schottky Coupled Cell Arrays" by C. U. Buscaglia et al, Vol. 24, No. 10, Mar. 10, 1982, pages 5167–5168.

SUMMARY OF THE INVENTION

It is an object of the present invention to provide an improved cascoded select circuit for current switch emitter follower logic.

It is an object of the present invention to provide an improved reduced power select gate having complementary binary input terminals and complementary binary output terminals and a select/deselect control input terminal whereby under control of a select/deselect signal said select gate assumes a select state or an inhibited (deselected) state.

The invention may be summarized as cascode current switch circuit means for controllably receiving a binary input and providing a binary output, said cascode current switch circuit means including: interconnected upper and lower current switch circuits; said lower current switch including a control input adapted to receive a signal for placing said cascode current switch circuit means in either a SELECT state or a DESELECT state; and said cascode current switch circuit means being characterized by the inclusion of power reduction circuit means interconnecting said upper and lower current switch circuits, whereby the power consumption of said cascode current switch circuit means is reduced.

The invention may also be summarized as data bit selection means, for use in a data processing system, such as a directory memory system or the like, said data bit selection means comprising: at least first, second and third data bit select circuits, each of said data bit select circuits having a data bit (true) input terminal and a data bit (complement) input terminal, a data bit (true) output terminal and a data bit (complement) output terminal, and a deselect/select control terminal, a first (true) bus connected in common to each of said data bit (true) output terminals of said data bit select circuits; a second (complement) bus connected in common to each of said data (complement) output terminals; and, each of said data bit select circuits comprising cascode current switch circuit means having at least interconnected upper and lower current switch circuit means each of said data bit select circuits being characterized by power reduction circuit means coupling said lower current switch circuit means to said true and complement data bit output terminals of said data bit select circuit.

These and other features and advantages of the invention will be apparent from the following more particular description of the preferred embodiment of the invention as illustrated in the accompanying drawings.

BRIEF DESCRIPTION OF THE DRAWING

FIGS. 7A and 7B of the subject application correspond to and are essentially identical to FIGS. 1A and 1B of referenced U.S. patent application Ser. No. 666,850 filed Oct. 30, 1984.

DESCRIPTION OF THE PREFERRED EMBODIMENT

Figure 4:
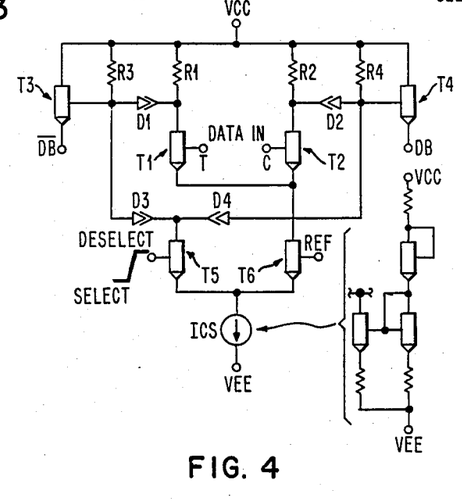
FIG. 4 discloses, in accordance with the invention, a three state Current Switch Emitter Follower gate having differential states and an output state.

A three state C.S.E.F. gate with differential output and negative inhibit has been implemented in the past. See FIGS. 1 and 2. The advantages of a differential bus over a single ended bus are offset by the increased power and delay of these circuits. The circuit in accordance with the invention, FIG. 4 provides the advantages of differential bussing without the extra power of prior art circuits and better performance than a single ended gate. The employment of the circuit in accordance with the invention in a memory systems provides a differential data bus and eliminates read 0/read 1 skew and the problems inherent with generating a tracking reference.

Circuit Operation:

Referring to the select circuit in accordance with the invention, FIG. 4, current $I_{CS}$ is provided by a standard current source such as a current mirror. When the select line is high (deselect) $T_5$ is on and $T_6$ is off. Schottky diodes $D_3$ and $D_4$ share current $I_{CS}$, and $I_{CS}/2$ flows through each of the resistors $R_3$ and $R_4$, thus the bases of emitter followers $T_3$ and $T_4$ are respectively at a low voltage. The circuit is disabled (deselected).

When the select line is low $T_6$ is on, $T_5$ is off and either $T_1$ or $T_2$ is on depending on the input data. If $T_2$ is on and $T_1$ is off, output $\overline{DB}$ is high because no current flows through $R_1$ and $R_3$. $I_{CS}/2$ current flows through $R_2$ and $R_4$ and Schottky diode $D_2$ so DB is low. From the above $$R_1 = \frac{2 V_{FD1}}{I_{CS}} + R_3 \text{ and } R_2 = \frac{2 V_{FD2}}{I_{CS}} + R_4$$

$V_{FD1}$ is the forward voltage drop across Schottky diode 1. When the circuit is deselected, $I_{CS}$ divides evenly between diodes 3 and 4. Therefore $I_{CS}/2$ flows through $R_3$ and $R_4$ and the bases of $T_3$ and $T_4$ are at a low voltage. In order to achieve the same low state voltage level at the bases of $T_3$ and $T_4$ when in select state as in deselect state, $I_{CS}/2$ must flow through either $D_1$ and $R_3$ or $D_2$ and $R_4$ depending on input data when selected.

$$V_{R3} \text{ (voltage across } R_3) + V_{FD1} = V_{R1}$$

$$I_{R3} R_3 + V_{FD1} = I_{R1} R_1$$

$$I_{R3} = \frac{I_{CS}}{2} = I_{R1}$$

Hence $$\frac{I_{CS}}{2} R_3 + V_{FD1} = \frac{I_{CS}}{2} R_1$$

$$R_3 + \frac{2 V_{FD1}}{I_{CS}} = R_1$$

Figure 1:
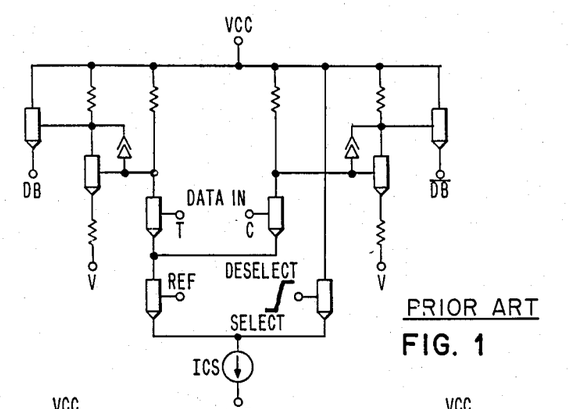
FIG. 1 discloses a known three state Current Switch Emitter Follower gate having differential output states and an output inhibited state.
Figure 2:
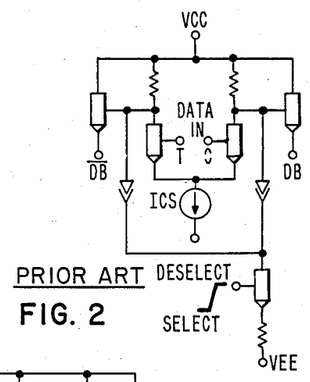
FIG. 2 discloses yet another known three state Current Switch Emitter Follower gate having differential output states and an output inhibited state.

Unlike the circuit of FIG. 1, $I_{CS}$ sets the total power in all modes of operation. Extra power for inverters or deselect is not needed as in the circuit of FIG. 1. In addition one state of delay (inverter) is eliminated.

In a directory memory chip a requirement is to select data onto a data bus. It is desirable to have a differential data bus. A differential data bus has performance and symmetrical switching advantages over a single ended bus (no read 0/read 1 skew). In C.S.E.F. logic, the emitter follower dot is used in the implementation of the data bus; however, the emitter follower dot requires negative inhibit. The disclosed select gate of FIG. 4 solves this problem with minimum delay and power in C.S.E.F. logic.

Figure 5:
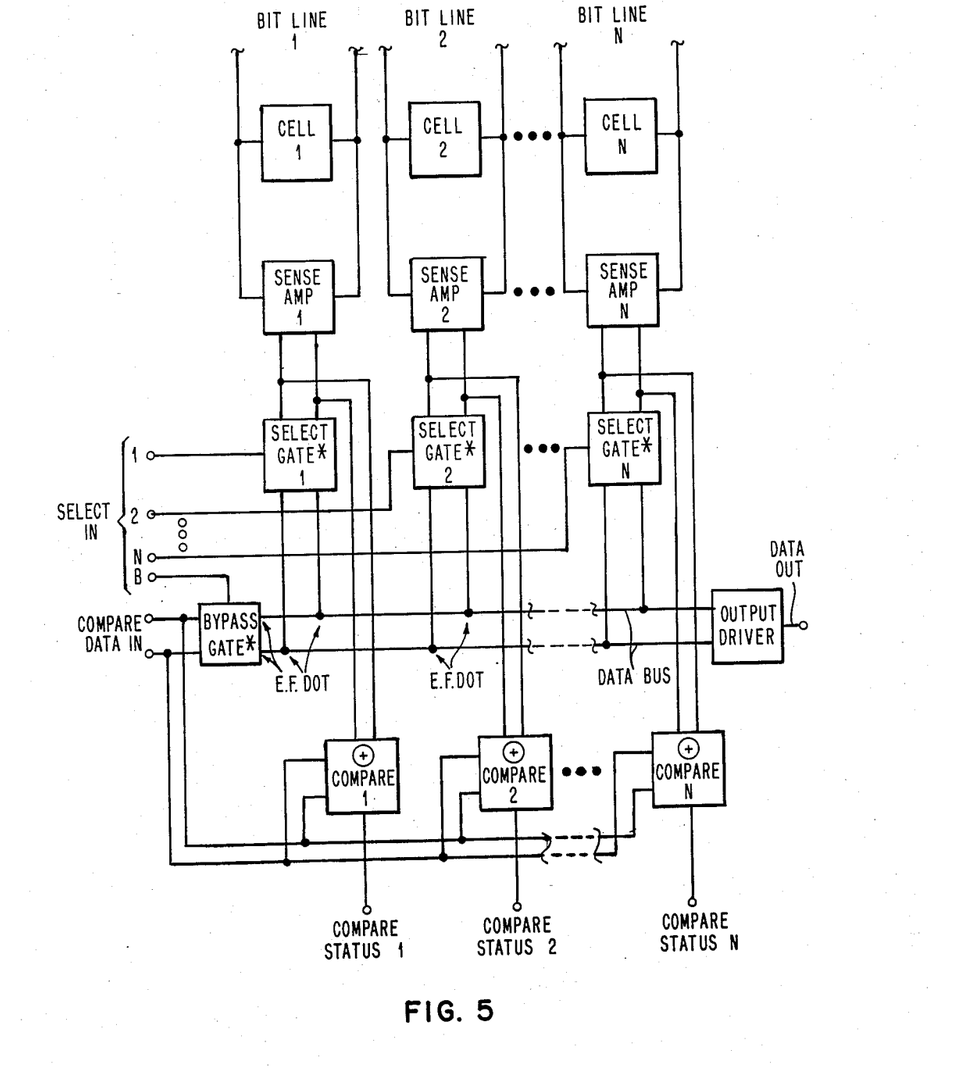
FIG. 5 illustrates the employment of a number of Select gates and a Bypass gate in a directory array chip and all in accordance with the invention.

FIG. 5 shows of a portion of a directory array chip. In each memory column a single memory cell is shown for illustration; however, any number of cells may be implemented. It is necessary to have array data from cell 1, cell 2 or cell N or a compare data bit appear at the data out. Simultaneously array data from cell 1, cell 2 or cell N must appear at the input to their respective compare circuits to generate compare status signals 1, 2, and N. Choice of cell 1 data, cell 2 data, cell N data or compare data, at the data output is made via select input lines 1, 2, N or B.

The function of the select gate is to inhibit its corresponding cell data bit from interfering with the data bus when another cell data bit or compare data bit is desired at the data output. Similarly the function of the bypass gate is to inhibit the compare data bit from interfering with the data bus when cell data is desired at the data output.

Select gate-1, select gate 2, select gate-N and the bypass gate are identical; and each correspond identically to the select circuit shown in FIG. 4. Operation of the select gate circuit of FIG. 4 has been explained earlier herein.

As can be seen from the portion of the directory chip shown in FIG. 5 for every pair of bit lines there is a select gate. Therefore, each select gate circuit, FIG. 4, must fit within the bit pitch of one array cell in the physical design. The select circuit, in accordance with the invention, offers a compact layout because Schottky diodes 3 and 4 are integrated in the same collector as $T_5$. Similar Schottky diode D1 is integrated with $T_1$ and Schottky D2 is integrated with $T_2$.

Figure 6:
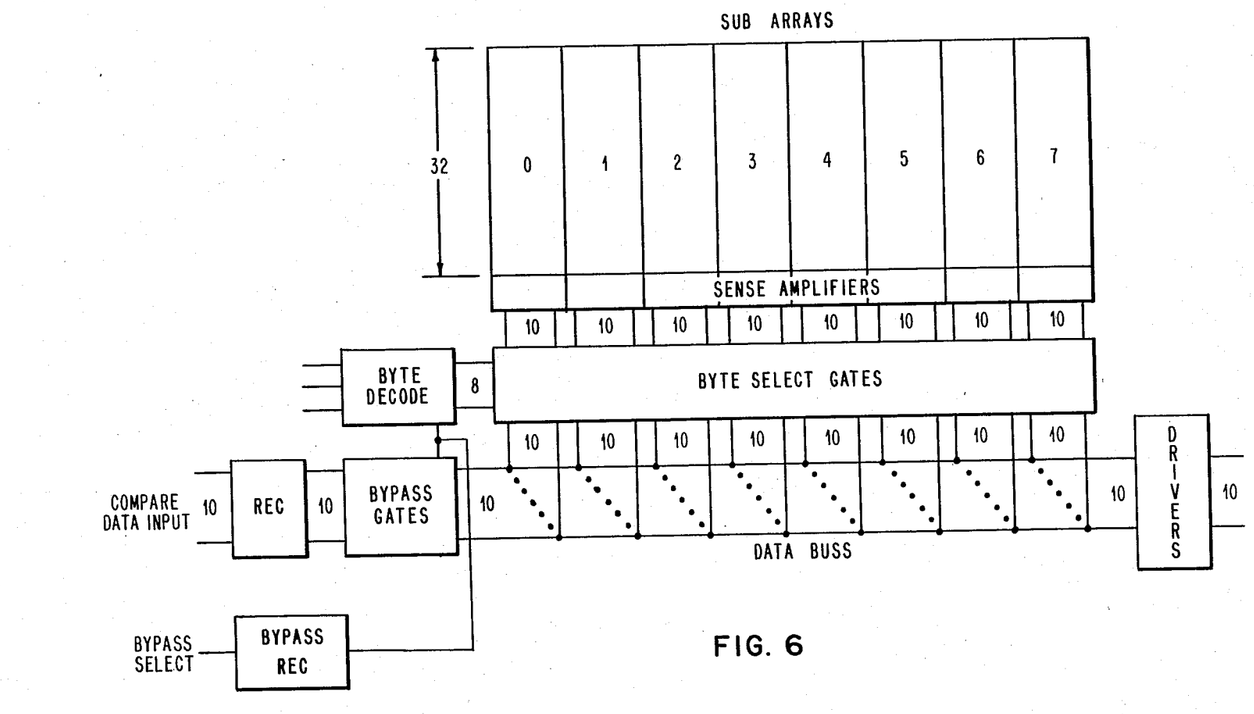
FIG. 6 is a further illustration of the employment of a number of Select gates and a Bypass gate in a directory array chip and all in accordance with the invention.

In FIG. 6, a directory array is organized into eight subarrays. Each subarray is ten bits wide and thirty-two bits high. During a read operation one wordline containing eight ten bit 'bytes' is selected. The chip architecture requires array data to follow two paths. All eight bytes (eighty bits) of the selected word must appear at the compare logic inputs (not shown) for the compare function. Also one of the eight bytes is selected via byte decode inputs to be driven off chip. Since one byte must be fed to the data output drivers the chip has a ten bit wide data bus requirement.

In addition, the chip has a bypass function where ten bits coming from off chip (called compare data input byte) can be steered onto the data bus to appear at the data outputs in lieu of array data. See FIG. 6.

When one of the nine available ten bit bytes (eight array bytes plus a compare data input byte) is selected onto the data bus the other eight bytes must be inhibited. The byte select gates, the bypass gates and the data bus emitter follower dot perform this select and inhibit function.

In order to take advantage of the logic and inherent speed of the emitter follower dot, the byte select and bypass gates must provide a negative inhibit. It is also desirable to have a differential data bus. A differential data bus has performance and symmetrical switching advantages over a single ended bus (no read 0/read 1 skew).

Figure 3:
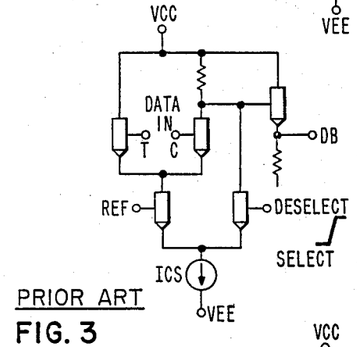
FIG. 3 discloses a known three state single ended select circuit.

A differential select circuit as disclosed offers several advantages over a single ended select circuit, FIG. 3. The differential circuit allows a smaller signal swing, therefore obtaining faster switching times and better performance.

The differential circuit rejects common mode noise. Noise on the most positive power supply propagates to both the low and high level bus lines therefore no false switching occurs at receiving circuit. With a single ended circuit the noise may propagate to the bus, but not to the reference which could be far away from the circuit. Therefore false switching may occur.

Compared to the single ended circuit, the differential circuit has reduced on chip generated delta I noise when changing the state of input data. The directory chip may have typically 10 of these circuits active. Any data change with the differential circuit will not cause local high current demands because of the complementary outputs' cancelling effect. Ten single ended circuits all changing from a '0' to '1' state may cause current glitches in the most positive power supply.

Because of the different rising and falling delays associated with emitter follower outputs (active pullup vs. passive pull down), the single ended circuit will have delay skew between selecting a '1' or a '0'. Switching around a fixed reference, the emitter follower has different delay between going from a '0' to a '1' through the reference voltage, and vice versa. The symetrical nature of the differential circuit and absence of a switching reference, eliminates this skew.

The disclosed circuit provides negative inhibit and differential output, and is desirably used for the byte select and bypass gate functions on a directory chip.

Referring to the select circuit of FIG. 4 and to directory chip of FIG. 5, for the byte select application the lower portion of the cascode in the circuit of FIG. 4 receives the select signal from the byte decode circuitry and the upper portion receives data from the array sense amplifiers. For the bypass gate application, the lower cascode receives a select signal from the bypass receiver and the upper portion receives data from the compare data input receivers. The input voltage level requirements of the disclosed circuit are compatible array circuit families and power supplies. Therefore the output levels of the sense amplifiers and byte decode circuits match the input levels of the disclosed circuit.

In summary, use of disclosed circuit, FIG. 4, decidedly enhances and improves the directory array byte select and bypass gate functions. The circuit allows the performance and reliability advantages of a differential data bus, with lower power and smaller physical design over the conventional implementations.

Reference is made to U.S. patent application Ser. No. 666,580 entitled "Directory Memory System" filed Oct. 30, 1984 by J. E. Andersen et al and of common assignee herewith. The above identified application (Ser. No. 666,580) is incorporated herein by reference thereto to the full and same extent as though it was set-forth herein verbatim.

Figures 7, 7B:
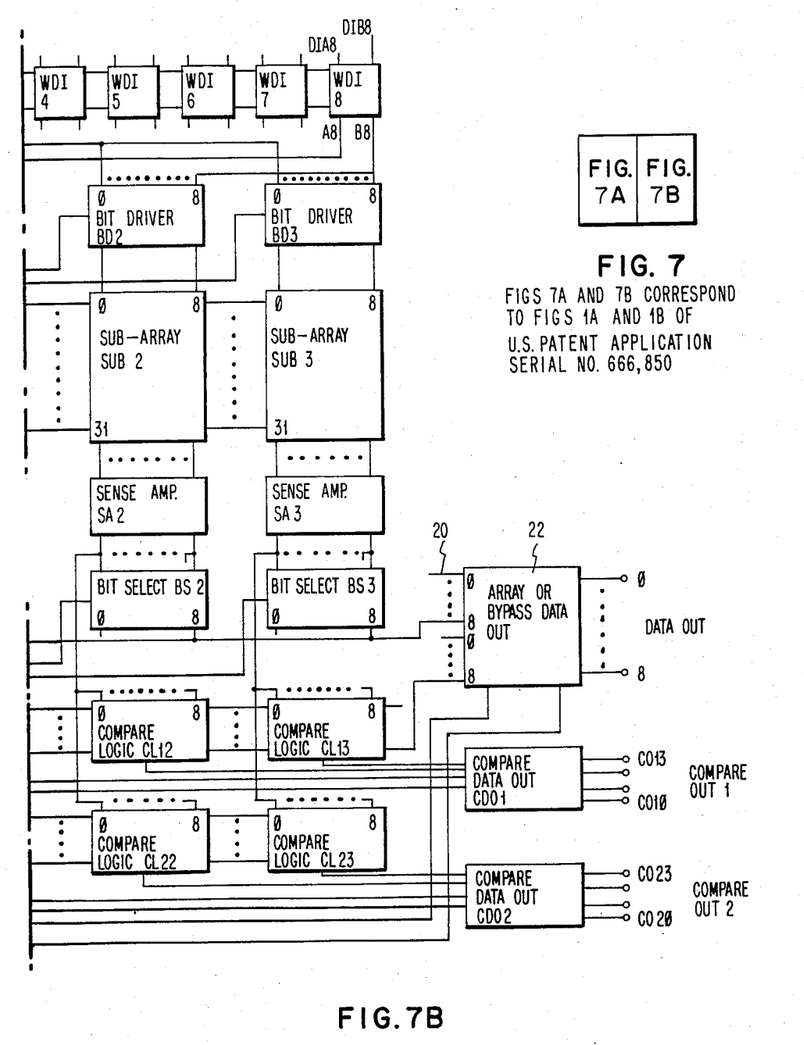
FIGS. 7A and 7B joined together as shown in FIG. 7 disclose a directory system.
Figure 7A:
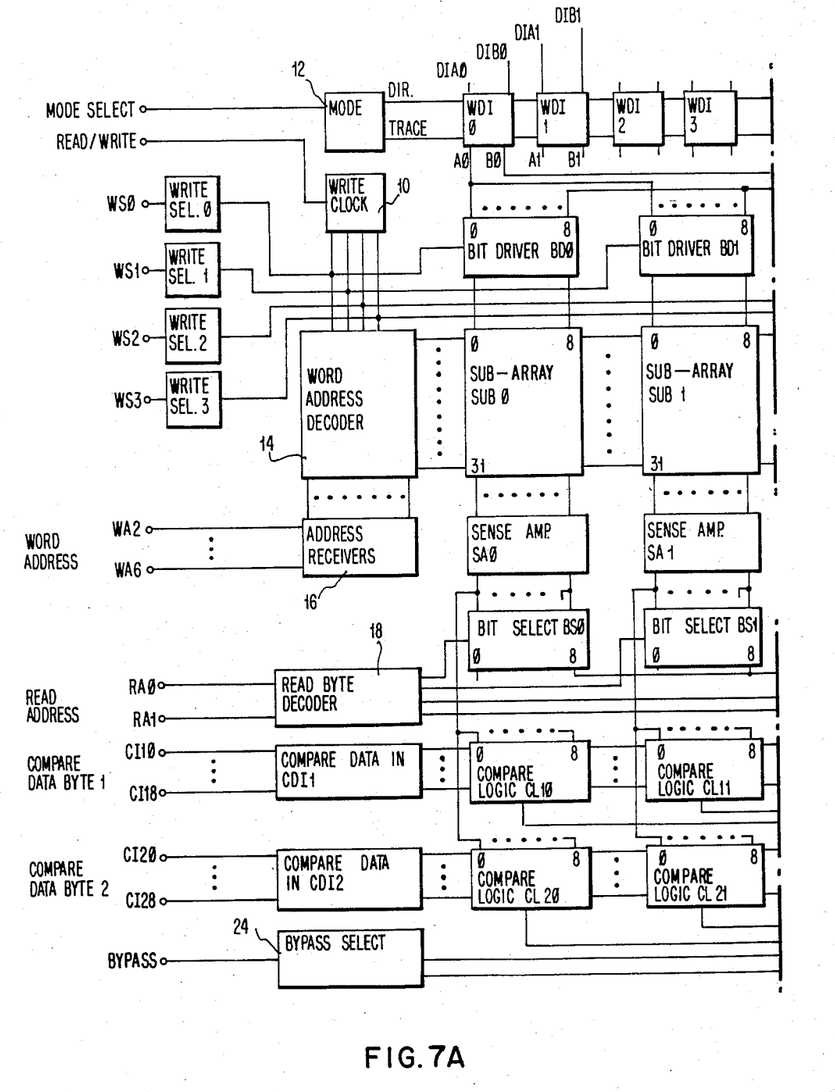

FIG. 7 (formed by joining FIGS. 7A and 7B) of the subject application correspond identically to FIGS. 1A and 1B of U.S. patent application Ser. No. 666,580. It will be apparent, in view of the foregoing explanation of applicants invention that the select circuit of FIG. 4 finds particular utility when employed in a directory memory system of the type and as shown the block diagram of FIG. 7.

While this invention has been particularly described with reference to the preferred embodiments thereof, it will be understood by those skilled in the art that the foregoing and other changes and details may be made therein without departing from the spirit and scope of the invention.

What is claimed is:

1. In a data processing system, data bit selection means, said data bit selection means comprising:
    at least first, second and third data bit select circuits, each of said data bit select circuits having a data bit (true) input terminal and a data bit (complement) input terminal, a data bit (true) output terminal, a data bit (complement) output terminal, and a deselect/select control terminal,
a first (true) bus connected in common to each of said data bit (true) output terminals of said data bit select circuits;
a second (complement) bus connected in common to each of said data (complement) output terminals; and,
each of said data bit select circuits comprising:
    first through sixth transistors, each of said first through sixth transistors having an emitter, base and collector;
    a first resistor serially connected between said collector of said first transistor and a source of potential;
    a second resistor serially connected between said collector of said second transistor and said source of potential;
    a third resistor connected across the base-collector junction of said third transistor;
    a fourth resistor connected across the base collector junction of said fourth transistor;
    a first connection means connecting in common said collector of said third transistor, said collector of said fourth transistor and said first potential source;
    second connection means connecting in common said emitter of said first transistor, said emitter of said second transistor and said collector of said sixth transistor;
    third connection means connecting in common said emitter of said fifth transistor, said emitter of said sixth transistor and a constant current source;
    a first Schottky barrier diode having an anode connected to said base of said third transistor and a cathode connected to said collector of said first transistor;
    a second Schottky barrier diode having an anode connected to said base of said fourth transistor and a cathode connected to said collector of said second transistor;
    a third Schottky barrier diode having an anode connected to said base of said third transistor and a cathode connected to said collector of said fifth transistor;
    a fourth Schottky barrier diode having an anode connected to said base of said fourth transistor and a cathode connected to said collector of said fifth transistor;
    input circuit means for receiving a true/complement manifestation of a binary bit, said input circuit means comprising a data bit (true) input terminal connected to said base of said first transistor, and a data bit (complement) input terminal connected to said base of said second transistor;
    a deselect/select control terminal for receiving a select/deselect signal, said control terminal being connected to said base of said fifth transistor;
    said base of said sixth transistor connected to a source of reference potential; and
    output circuit means for providing a true/complement manifestation of a binary bit, said output circuit means comprising a data bit (true) output terminal connected to said emitter of said fourth transistor and a data bit (complement) output terminal connected to said emitter of said third transistor, whereby when a select signal is impressed on said control terminal said output binary bit electrically manifested by said output circuit means will bear a fixed relationship to the input binary bit impressed on said input circuit means, and when a deselect signal is impressed on said control terminal said output circuit means will assume an inhibited state.

2. A three state cascoded current switch emitter follower select circuit for providing a differential output or an output inhibited state, said select circuit comprising:
   first through sixth transistors, each of said first through sixth transistors having an emitter, base and collector;
   a first resistor serially connected between said collector of said first transistor and a source of potential;
   a second resistor serially connected between said collector of said second transistor and said source of potential;
   a third resistor connected across the base collector junction of said third transistor;
   a fourth resistor connected across the base collector junction of said fourth transistor;
   a first connection means connecting in common said collector of said third transistor, said collector of said fourth transistor and said first potential source;
   second connection means connecting in common said emitter of said first transistor, said emitter of said second transistor and said collector of said sixth transistor;
   third connection means connecting in common said emitter of said fifth transistor, said emitter of said sixth transistor and a constant current source;
   a first Schottky barrier diode having an anode connected to said base of said third transistor and a cathode connected to said collector of said first transistor;
   a second Schottky barrier diode having an anode connected to said base of said fourth transistor and a cathode connected to said collector of said second transistor;
   a third Schottky barrier diode having an anode connected to said base of said third transistor and a cathode connected to said collector of said fifth transistor;
   a fourth Schottky barrier diode having an anode connected to said base of said fourth transistor and a cathode connected to said collector of said fifth transistor;
   input circuit means for receiving a true/complement manifestation of a binary bit, said input circuit means comprising a (true) input terminal connected to said base of said first transistor, and a (complement) input terminal connected to said base of said second transistor;
   a control terminal for receiving a select/deselect signal, said control terminal being connected to said base of said fifth transistor;
   said base of said sixth transistor connected to a source of reference potential;
   output circuit means for providing a true/complement manifestation of a binary bit, said output circuit means comprising a (true) output terminal connected to said emitter of said fourth transistor and a (complement) output terminal connected to said emitter of said third transistor, whereby when a select signal is impressed on said control terminal said output binary bit electrically manifested by said output circuit means will bear a fixed relationship to the input binary bit impressed on said input circuit means, and when a deselect signal is impressed on said control terminal said output circuit means will assume said output inhibited state.

3. In a directory memory system chip a plurality of subarrays of memory cells, each subarray of the memory cells having n columns and m rows, said m cells of each of said n columns of memory cells connected between a discrete pair of bit lines, a n bit wide differential output bus, said n bit wide differential output bus including n discrete differential output lines, n three state select circuits, each of said n select circuits connected between a discrete pair of said n bit lines and a discrete one of said n discrete differential output lines, each of said n three state select circuits having a control terminal for receiving a select/deselect signal, each of said n three state select circuits including:
   interconnected upper and lower current switch circuits;
   said lower current switch including said control terminal for receiving said select/deselect signal and placing said select circuit means in either a SELECT state or a DESELECT state; and
   said select circuit being characterized by the inclusion of power reduction circuit means interconnecting said upper and lower current switch circuits, whereby the power consumption of the directory memory system is reduced, said directory memory system being further characterized in that each of said n select circuits comprises;
   first through sixth transistors, each of said first through sixth transistors having an emitter, base and collector;
   a first resistor serially connected between said collector of said first transistor and a source of potential;
   a second resistor serially connected between said collector of said second transistor and said source of potential;
   a third resistor connected across the base-collector junction of said third transistor;
   a fourth resistor connected across the base collector junction of said fourth transistor;
   a first connection means connecting in common said collector of said third transistor, said collector of said fourth transistor and said first potential source;
   second connection means connecting in common said emitter of said first transistor, said emitter of said second transistor and said collector of said sixth transistor;
   third connection means connecting in common said emitter of said fifth transistor, said emitter of said sixth transistor and a constant current source;
   a first Schottky barrier diode having an anode connected to said base of said third transistor and a cathode connected to said collector of said first transistor;
   a second Schottky barrier diode having an anode connected to said base of said fourth transistor and a cathode connected to said collector of said second transistor;
   a third Schottky barrier diode having an anode connected to said base of said third transistor and a cathode connected to said collector of said fifth transistor;

a fourth Schottky barrier diode having an anode connected to said base of said fourth transistor and a cathode connected to said collector of said fifth transistors;

input circuit means for receiving a true/complement manifestation of a binary bit, said input circuit means comprising a (true) input terminal connected to said base of said first transistor, and a (complement) input terminal connected to said base of said second transistor;

a control terminal for receiving a select/deselect signal, said control terminal being connected to said base of said fifth transistor;

said base of said sixth transistor connected to a source of reference potential; and output circuit means for providing a true/complement manifestation of a binary bit, said output circuit means comprising a (true) output terminal connected to said emitter of said fourth transistor and a (complement) output terminal connected to said emitter of said third transistor, whereby when a select signal is impressed on said control terminal said output binary bit electrically manifested by said output circuit means will bear a fixed relationship to the input binary bit impressed on said input circuit means, and when a deselect signal is impressed on said control terminal said output circuit means will assume an output inhibited state.

* * * * *